United States Patent
Ezzeddine

(10) Patent No.: US 7,327,131 B2
(45) Date of Patent: Feb. 5, 2008

(54) BALUN TRANSFORMER AND LOW-PASS FILTER

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 293 days.

(21) Appl. No.: 11/137,605

(22) Filed: May 25, 2005

(65) Prior Publication Data
US 2005/0264273 A1    Dec. 1, 2005

(30) Foreign Application Priority Data
May 25, 2004  (FR) ................................. 04 51023

(51) Int. Cl.
*H01F 17/00*    (2006.01)
*G05F 1/12*    (2006.01)

(52) U.S. Cl. ................................... 323/355
(58) Field of Classification Search ................ 323/247, 323/255, 259, 262, 355, 359; 336/65, 69, 336/137, 145, 170, 173, 180, 232
See application file for complete search history.

(56) References Cited

U.S. PATENT DOCUMENTS

| 4,378,472 | A | * | 3/1983 | Lechner ...................... 370/285 |
|---|---|---|---|---|
| 4,947,308 | A | * | 8/1990 | Gulczynski ................... 363/16 |
| 6,078,510 | A | * | 6/2000 | Spampinato et al. .... 363/21.13 |
| 6,690,124 | B2 | * | 2/2004 | Fernsler et al. ............. 315/382 |
| 7,049,712 | B2 | * | 5/2006 | Ying et al. .................... 307/66 |
| 2003/0151881 | A1 | | 8/2003 | Yue |
| 2004/0012474 | A1 | | 1/2004 | Hwu et al. |
| 2004/0130427 | A1 | | 7/2004 | Ezzeddine |

OTHER PUBLICATIONS

French Search Report from French Patent Application No. 04/51023, filed May 25, 2004.

* cited by examiner

*Primary Examiner*—Matthew V. Nguyen
(74) *Attorney, Agent, or Firm*—Lisa K. Jorgenson; James H. Morris; Wolf, Greenfield & Sacks, P.C.

(57) ABSTRACT

A mode-switching transformer, combined with a differential low-pass filter, including a first planar winding in a first conductive level having an external end terminal defining a common-mode input/output terminal; a second planar winding electrically in series with the first winding and formed in a second conductive winding; at least one capacitor connecting an external end terminal of the second winding to ground; a third winding formed in the second conductive level and having an external end terminal defining a first differential mode access; and a fourth winding, electrically in series with the third winding and formed in the first conductive level, an external end terminal of the fourth winding defining a second differential-mode access terminal and the central ends of all windings being interconnected to ground.

20 Claims, 2 Drawing Sheets

BALUN TRANSFORMER AND LOW-PASS FILTER

BACKGROUND OF THE INVENTION

1. Field of the Invention

The present invention relates to the field of mode-switching transformers (BALUN) having the function of converting a common mode signal into a differential mode signal and, more specifically, such transformers intended to be associated with a low-pass filter.

2. Discussion of the Related Art

FIG. 1 very schematically shows in the form of blocks a first example of association of a mode-switching transformer 1 (BALUN) and of low-pass filters 2 and 3 (LPF). In this example, filters 2 and 3 are connected to the differential outputs of balun 1 having its common-mode input connected to an antenna 4. This is a typical example of application of balun transformers used in portable phones. They are then intended to convert the signals received on the antenna to make them exploitable by the circuits internal to the telephone.

FIG. 2 shows a second conventional example of assembly associating a low-pass filter 5 with a balun transformer 1. In this example, the low-pass filter is placed upstream of transformer 1, that is, between antenna 4 and the common-mode input of balun 1.

FIG. 3 shows the equivalent electric diagram of a balun transformer 1. On the common-mode side, two inductive elements 11 and 12 are series-connected between a common-mode access UNB and a port left open O. On the differential mode side, two inductive elements 13 and 14 are series-connected between the two differential-mode accesses BAL1 and BAL2. The junction point of inductances 13 and 14 is grounded.

Elements 11 to 14 are sized according to the central frequency of the passband desired for the balun, each inductive winding 11 to 14 having a length equal to one quarter of the wavelength of this central frequency.

FIG. 4 shows a conventional example of an equivalent electric diagram of a low-pass filter 2, 3, or 4. Such a filter is generally symmetrical and comprises two input-output terminals 15 and 16 between which are connected a first capacitor 17 in parallel with an inductance 18, each terminal 15 and 16 being further grounded by a capacitor, respectively, 19 or 20.

The filter elements are sized according to the cut-off frequency desired for the filter, this frequency being selected according to the passband of transformer 1.

The fact that the two mode-switching elements (low-pass filter and balun) are separated from each other adversely affects the circuit integration compactness, and thus the miniaturization.

SUMMARY OF THE INVENTION

The present invention aims at reducing the bulk of balun transformers integrated with low-pass filters. The present invention especially aims at enabling integration on the same circuit of a balun transformer and of its low-pass filter.

The present invention also aims at providing an integrated balun transformer structure which is also used as a differential low-pass filter.

To achieve these and other objects, the present invention provides a mode-switching transformer, comprising:

a first planar winding in a first conductive level having an external end terminal defining a common-mode input/output terminal;

a second planar winding electrically in series with the first winding and formed in a second conductive level;

at least one capacitor connecting an external end terminal of the second winding to ground;

a third winding formed in said second conductive level and having an external end terminal defining a first differential mode access; and a fourth winding, electrically in series with the third one and formed in said first conductive level, an external end terminal of the fourth winding defining a second differential-mode access terminal and the central ends of all windings being interconnected to ground, to form a differential low-pass filter.

According to an embodiment of the present invention, at least the first, third, and fourth windings have identical lengths selected according to the central frequency of the passband desired for the mode-switching transformer.

According to an embodiment of the present invention, the second winding has a length identical to the three others.

According to an embodiment of the present invention, said capacitor is sized according to a desired rejection frequency, greater than the central frequency of the mode-switching transformer passband.

According to an embodiment of the present invention, the first and fourth windings, as well as the second and third windings, are interdigited.

The foregoing objects, features, and advantages of the present invention will be discussed in detail in the following non-limiting description of specific embodiments in connection with the accompanying drawings.

DETAILED DESCRIPTION

Figure 1:
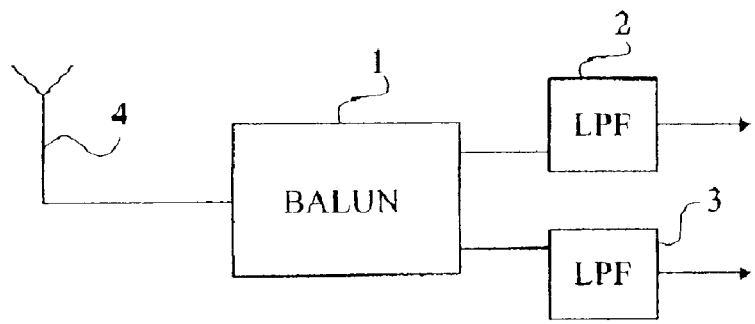
FIGS. 1 to 4, previously described, are intended to show the state of the art and the problem to solve.
Figure 2:
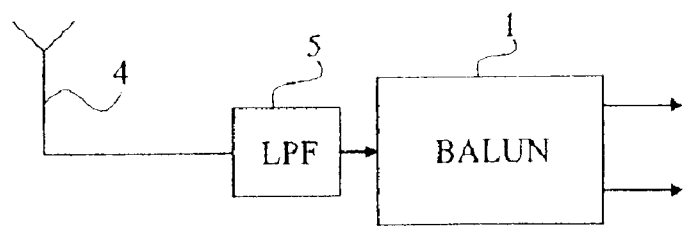
Figure 3:
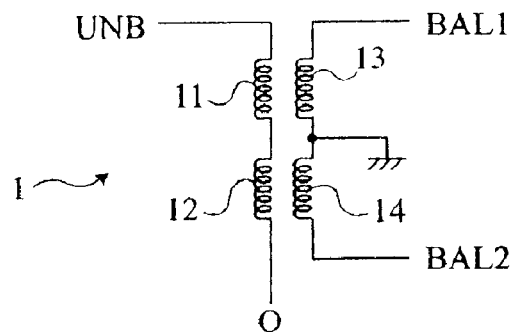
Figure 4:
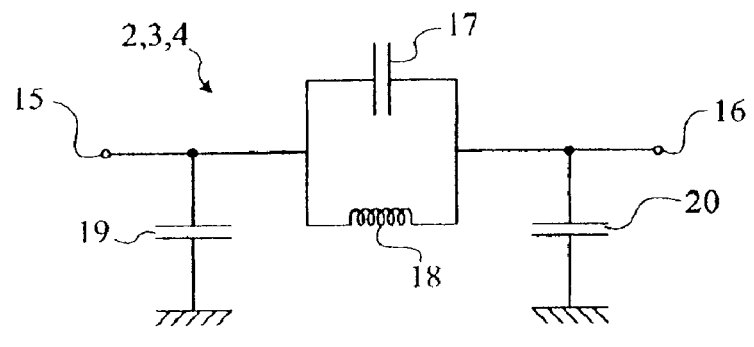

The same elements have been referred to with the same reference numerals in the different drawings. For clarity, only those elements that are necessary to the understanding of the present invention have been shown in the drawings and will be described hereafter. In particular, the different elements connected to the input/output of a mode-switching transformer or differential low-pass filter according to the present invention have not been described in detail. The present invention is compatible with any conventional use of a mode-switching transformer, associated with a low-pass filter on the common-mode side, or with two low-pass filters on the differential mode side.

A feature of the present invention is to electrically place, in series with the first winding (connected to the common-mode access) of a mode-switching transformer, a grounded inductive and capacitive filtering impedance. Another feature of the present invention is to also ground the junction point of the first winding with this impedance, and to couple two-by-two the inductances of the mode-switching transformer.

Figure 5:
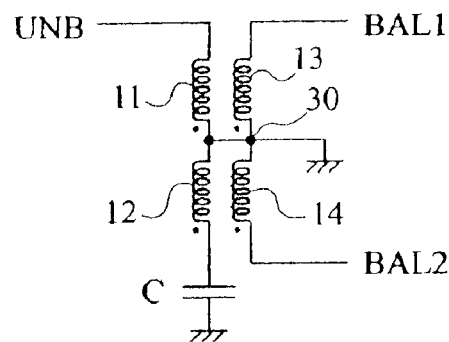
FIG. 5 shows the equivalent electric diagram of an embodiment of a mode-switching transformer according to the present invention.

FIG. 5 shows the equivalent diagram of a mode-switching transformer also forming a differential low-pass filter according to the present invention.

As in a conventional mode-switching transformer, two differential-mode access terminals BAL1 and BAL2 are connected to each other by two inductive elements 13 and 14 in series, junction point 30 being connected to ground (or to any other reference voltage). Still as in a conventional transformer, a common-mode access UNB is connected to an inductive winding 11 forming a primary of the transformer, this winding being in series with a second primary winding 12 which is conventionally left in the air.

According to the present invention, a capacitor C grounds the free end of winding 12. Further, the junction point of windings 11 and 12 is also grounded.

For the transformer effect, inductive elements 11 and 13 are coupled to each other, and so are inductive elements 12 and 14.

Inductance 12 and capacitor C form a frequency-rejection element having a cut-off frequency depending on their respective values.

Preferably, to optimize the balun transformer function, inductive windings 11, 13, and 14 are formed with a λ/4 length, where λ represents the central frequency of the passband desired for the mode-switching transformer. This width condition is not imperative for inductance 12 but, as will be seen hereafter, it is simpler to form this winding with the same length as all the others.

According to the present invention, the structure shown in FIG. 5 is integrated by forming all inductances 11, 12, 13, and 14 in the form of planar conductive windings, the coupling being obtained by stacking up these conductive windings. Further, the windings are interlaced or interdigited two by two in a same conductive level.

The rejection element can be considered as forming an additional secondary for the mode-switching transformer. Thus, winding 11 represents the primary winding, windings 13 and 14 form the first secondary providing the differential outputs, and a second secondary of the transformer is formed by the filtering element (inductance 12 and capacitor C). Indeed, by the ground connection of winding 11, only the coupling via windings 13 and 14 enables power transfer between windings 11 and 12.

Figure 6:
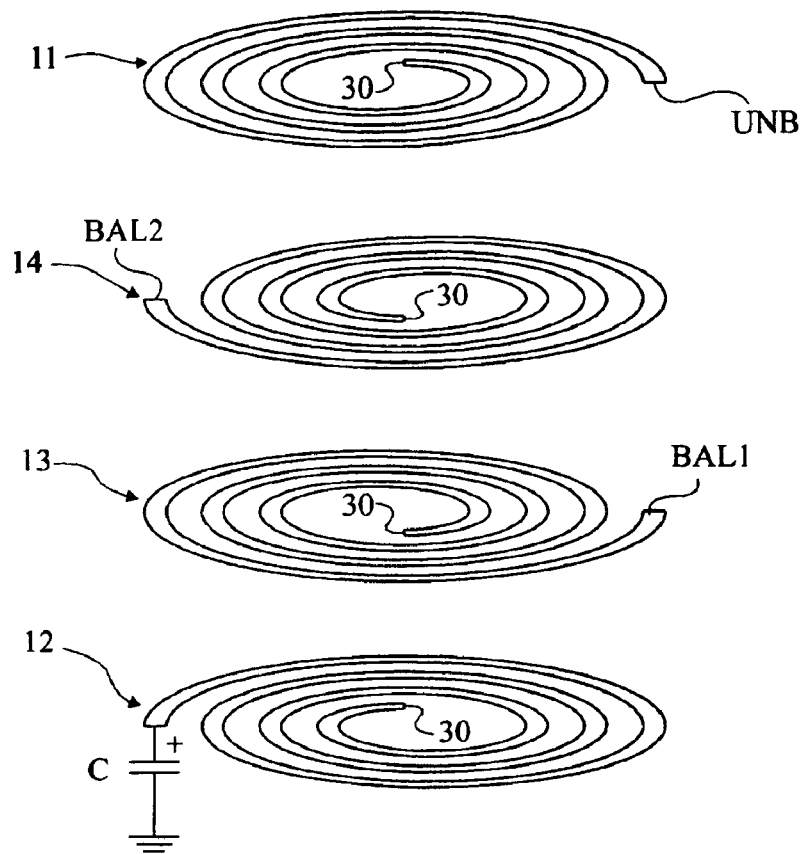
FIG. 6 illustrates the stacked forming of the inductive windings of a mode-switching transformer according to the present invention.

FIG. 6 illustrates, in an exploded perspective view, an example of the forming of the different windings of a transformer-filter according to the present invention.

Figure 7:
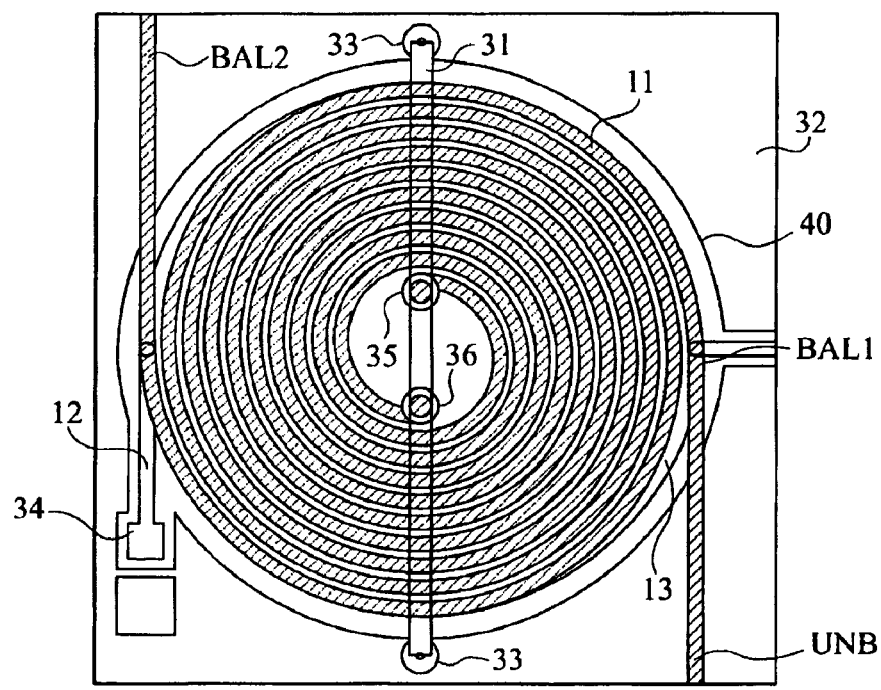
FIG. 7 is a top view of an integrated transformer according to the present invention.

FIG. 7 is a top view of an integrated transformer-filter according to the present invention.

In FIG. 6, the interconnections between the different windings have not been shown. Further, the windings formed in the same conductive level as an upper level have been shown in dotted lines.

It is assumed that the upper winding in the vertical orientation of FIG. 6 is primary is winding 11 having its external end defining terminal UNB. Central end 30 of the spiral is connected by a via 35 (FIG. 7) to a second metallization level (assumed to be the lower one) in which is further formed a ground plane 32 (FIG. 7). Via 35 connects the central end (node 30 from the electrical point of view) of second winding 12 formed in this second conductive level. As illustrated in FIG. 7, the windings of the second level are formed in a circular opening 40 of ground plane 32. Via 35 prolongs towards a third metallization level (for example, upper) in which is formed a bridge 31 following the structure diameter to connect central node 30 to ground plane 32. As an alternative, another via than the extension of via 35 is provided. Vias 33 connect the ends of bridge 31 to plane 32.

Winding 12 has its external end connected to a first electrode 34 of capacitor C formed in the same metallization level. The other capacitor electrode is formed in the metallization level ground plane 32. The capacitor dielectric is formed by the insulating layer (not visible in the drawings) separating the first and second metallization levels. As an alternative, the two capacitor electrodes are formed in the second and third levels or in the first and third levels.

First secondary winding 13 is formed in the same metallization level as winding 12 to be coupled with winding 11. Its central end is connected to ground 32 by a via 36, bridge 31 and vias 33. The external end of winding 13 defines terminal BAL1. Windings 12 and 13 are interdigited to be formed in the same conductive level. Finally, second secondary winding 14 is formed in the same metallization level as winding 11 by being interdigited therewith and its external end defines terminal BAL2. Via 36 is used as a connection for the central ends of windings 13 and 14.

The entire structure of the present invention may be integrated in three metallization levels and, with appropriate rotation directions for the windings, the vias and bridges can be minimized to have the different contacts stick out towards the outside of the structure.

As illustrated in FIG. 7, the bulk of the mode-switching transformer corresponds to the bulk of a conventional transformer having inductive windings of length λ/4. Accordingly, the present invention enables integrating the differential low-pass filter to the mode-switching transformer, without increasing its size.

The value to be given to capacitor C depends on the cut-off frequency desired for the rejection filter. For a given inductance value, the lower the capacitance, the more the cut-off frequency is pushed back towards high frequencies.

As a specific example of embodiment, for a mode-switching transformer comprising the differential low-pass filter and intended for a frequency band centered on a 900-megahertz frequency, by sizing all the windings to have a same λ/4 length, a capacitor of approximately 2 picofarads provides a rejection frequency of approximately 1.8 gigahertz while a capacitor of approximately 0.5 picofarads provides a rejection frequency of approximately 2.8 gigahertz An advantage of the present invention is that the rejection frequency may be adjusted by only varying the value of capacitor C, without it being necessary to intervene on the inductive windings.

Another advantage of the present invention is that by combining the filter and transformer functions in a single structure, insertion losses are reduced with respect to those of a conventional structure.

Another advantage of the present invention is that the amplitude imbalance parameters between the two paths BAL1 and BAL2, as well as the phase imbalance parameters remain in accordance with those of a conventional mode-switching transformer, since the windings have lengths maintained in λ/4 sections.

Of course, the present invention is likely to have various alterations, modifications, and improvements which will readily occur to those skilled in the art. In particular, the dimensions to be given to the different inductive windings as well as the values to be given to the capacitor depend on the application and especially on the rejection frequency desired for a given operating frequency of the mode-switching transformer. Further, the manufacturing of a transformer of the present invention by using the techniques currently used in the electronic industry to form integrated circuits on different substrates (for example, silicon or glass) is within the abilities of those skilled in the art. In particular, the association of a transformer of the present invention formed in metallization levels further used for the connections and contact recoveries of other integrated components in a same integrated circuit is an adaptation within their abilities.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mode-switching transformer, comprising:
    a first planar winding in a first conductive level having an external end terminal defining a common-mode input/output terminal;
    a second planar winding electrically in series with the first winding and formed in a second conductive level;
    at least one capacitor connecting an external end terminal of the second winding to ground;
    a third winding formed in said second conductive level and having an external end terminal defining a first differential mode access terminal; and
    a fourth winding, electrically in series with the third winding and formed in said first conductive level, an external end terminal of the fourth winding defining a second differential-mode access terminal, and central ends of each of the first, second, third and fourth windings being interconnected directly to ground, to form a differential low-pass filter.

2. The transformer of claim 1, wherein at least the first, third, and fourth windings have identical lengths selected according to the central frequency of the passband desired for the mode-switching transformer.

3. The transformer of claim 2, wherein the second winding has a length identical to the first, third, and fourth windings.

4. The transformer of claim 1, wherein said capacitor is sized according to a desired rejection frequency that is greater than a central frequency of a passband of the mode-switching transformer.

5. The transformer of claim 1, wherein the first and fourth windings are interdigited, and the second and fourth windings are interdigited.

6. A mode-switching transformer in combination with a differential low-pass filter, comprising:
    a first winding having first and second end terminals, the first end terminal being a common-mode input/output terminal;
    a second winding electrically coupled in series with the first winding and having first and second end terminals;
    a capacitor connected to the first end terminal of the second winding and also connected to ground;
    a third winding having first and second end terminals, the first end terminal of the third winding defining a first differential mode access terminal; and
    a fourth winding electrically coupled in series with the third winding and having first and second end terminals, the first terminal of the fourth winding defining a second differential-mode access terminal; wherein the second end terminals of each of the first, second, third and fourth windings are connected directly to ground.

7. The combination of claim 6, wherein at least the first, third, and fourth windings are the same length, the length being one quarter of a central frequency of a desired passband for the mode-switching transformer.

8. The combination of claim 7, wherein the second winding is the same length as the first, third, and fourth windings.

9. The combination of claim 6, wherein the capacitor is sized to produce a desired rejection frequency that is greater than a central frequency of the mode-switching transformer passband.

10. The combination of claim 6, wherein the first and fourth windings are interdigited.

11. The combination of claim 10, wherein the second and third windings are interdigited.

12. The combination of claim 6, wherein the first end terminals of each of the first, second, third and fourth windings are external end terminals, and the second end terminals of the first, second, third and fourth windings are central end terminals.

13. The combination of claim 6 wherein the first and third windings are formed in a first metallization level.

14. The combination of claim 13, wherein the second and fourth windings are formed in a second metallization level.

15. A method of manufacturing a mode-switching transformer that has a differential low-pass filter, comprising:
    electrically coupling a first winding in series with a second winding, the first winding having an external end terminal comprising a common-mode input/output terminal, and the second winding having an external end terminal;
    electrically coupling the external end terminal of the second winding to a capacitor;
    electrically coupling the capacitor to ground;
    electrically coupling a third winding in series with a fourth winding, the third winding having an external end terminal defining a first differential-mode access terminal, and the fourth winding having an external end terminal defining a second differential-mode access terminal; and
    electrically coupling central end terminals of each of the first, second, third and fourth windings directly to ground.

16. The method of claim 15, further comprising interdigiting the first and fourth windings.

17. The method of claim 16, further comprising interdigiting the second and third windings.

18. The method of claim 15, further comprising forming the first and third windings in a first metallization level.

19. The method of claim 16, further comprising forming the second and fourth windings in a second metallization level.

20. The method of claim 15, wherein electrically coupling the external end terminal to a capacitor comprises electrically coupling the external end terminal to a capacitor sized to provide a rejection frequency that is greater than a central frequency of a passband for the mode-switching transformer.

* * * * *